US012020908B2

(12) United States Patent
Lin et al.

(10) Patent No.: US 12,020,908 B2
(45) Date of Patent: Jun. 25, 2024

(54) ATOMIC LAYER ETCHING OF RU METAL

(71) Applicant: Applied Materials, Inc., Santa Clara, CA (US)

(72) Inventors: Yung-chen Lin, Gardena, CA (US); Chi-I Lang, Cupertino, CA (US); Ho-yung Hwang, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/663,937

(22) Filed: May 18, 2022

(65) Prior Publication Data
US 2022/0392752 A1 Dec. 8, 2022

Related U.S. Application Data

(60) Provisional application No. 63/196,481, filed on Jun. 3, 2021.

(51) Int. Cl.
*H01J 37/32* (2006.01)
*H01L 21/3065* (2006.01)

(52) U.S. Cl.
CPC .. *H01J 37/32467* (2013.01); *H01J 37/32816* (2013.01); *H01L 21/3065* (2013.01); *H01J 2237/327* (2013.01); *H01J 2237/3341* (2013.01)

(58) Field of Classification Search
None
See application file for complete search history.

(56) References Cited

U.S. PATENT DOCUMENTS

| 6,617,248 B1 * | 9/2003 | Yang | H01L 28/65 |
| | | | 257/E21.018 |
| 7,064,076 B2 | 6/2006 | Kulkarni | |
| 7,566,664 B2 | 7/2009 | Yan et al. | |
| 2017/0053810 A1 * | 2/2017 | Yang | C23F 4/00 |
| 2019/0311915 A1 | 10/2019 | Nagatomo et al. | |
| 2020/0135491 A1 * | 4/2020 | Cui | H01L 21/32137 |
| 2020/0312673 A1 | 10/2020 | Tsai et al. | |
| 2020/0402814 A1 | 12/2020 | Tahara et al. | |
| 2021/0098267 A1 | 4/2021 | Murakami | |

FOREIGN PATENT DOCUMENTS

JP 2001358133 A 12/2001

OTHER PUBLICATIONS

International Search Report and Written Opinion dated Sep. 14, 2022 for Application No. PCT/US2022/029899.

\* cited by examiner

*Primary Examiner* — Stephanie P Duclair
(74) *Attorney, Agent, or Firm* — Patterson + Sheridan, LLP

(57) ABSTRACT

Embodiments of the present disclosure generally relate to methods for etching materials. In one or more embodiments, the method includes positioning a substrate in a process volume of a process chamber, where the substrate includes a metallic ruthenium layer disposed thereon, and exposing the metallic ruthenium layer to an oxygen plasma to produce a solid ruthenium oxide on the metallic ruthenium layer and a gaseous ruthenium oxide within the process volume. The method also includes exposing the solid ruthenium oxide to a secondary plasma to convert the solid ruthenium oxide to either metallic ruthenium or a ruthenium oxychloride compound. The metallic ruthenium is in a solid state on the metallic ruthenium layer or the ruthenium oxychloride compound is in a gaseous state within the process volume.

18 Claims, 6 Drawing Sheets

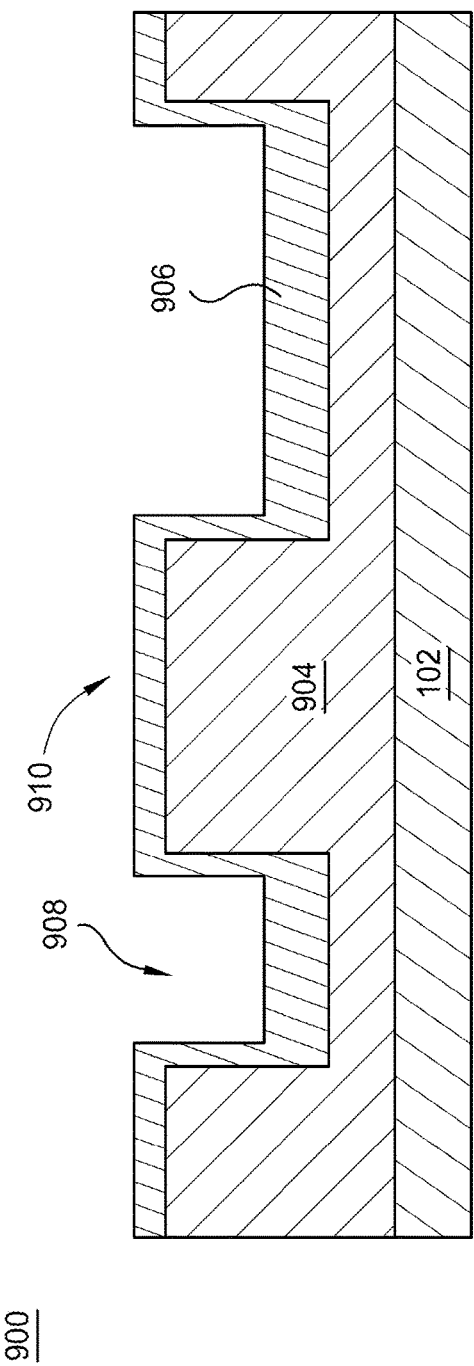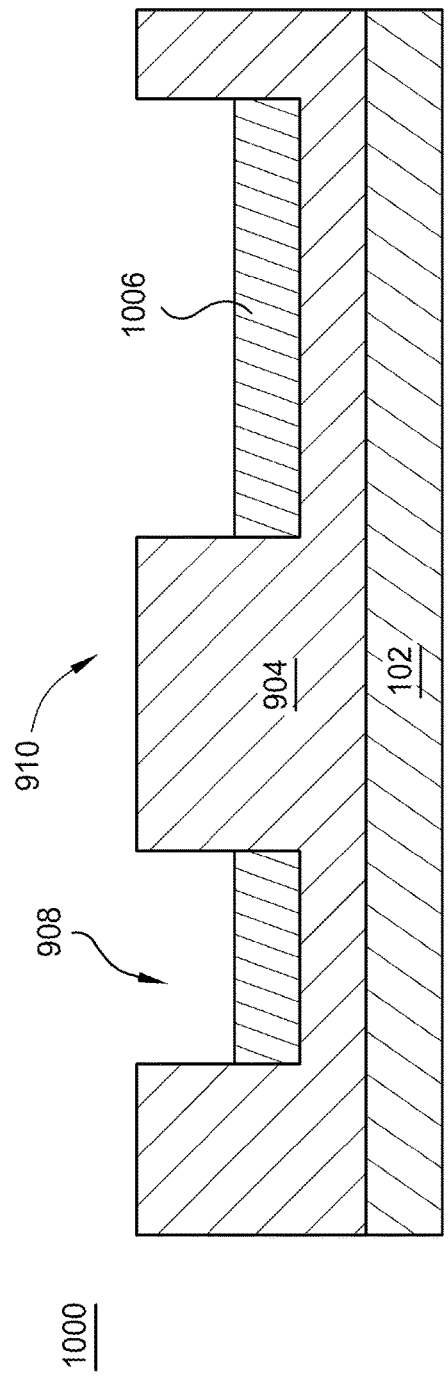

ATOMIC LAYER ETCHING OF RU METAL

CROSS-REFERENCE TO RELATED APPLICATIONS

This application claims the benefit of U.S. Provisional Patent Application Ser. No. 63/196,481, filed on Jun. 3, 2021, the entirety of which is herein incorporated by reference.

BACKGROUND

Field

Embodiments of the present invention generally relate to methods for atomic layer etching of small metal features.

Description of the Related Art

Reducing the size of integrated circuits (ICs) results in improved performance, increased capacity, and/or reduced cost. Each size reduction requires more sophisticated techniques to form the ICs. Shrinking transistor size, for example, allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of ICs, multi-gate transistors have become more prevalent as device dimensions continue to scale down. Conventional etching methods for etching scaled down metal interconnects are aggressive and difficult to control.

Therefore, there is a need to precisely control etching of devices having metal features with small dimensions without etching surrounding materials.

SUMMARY

Embodiments of the present disclosure generally relate to methods for etching materials. In one or more embodiments, a substrate is positioned in a process volume of a process chamber, where the substrate includes a metallic ruthenium layer disposed thereon. The metallic ruthenium layer is exposed to an oxygen plasma to produce a solid ruthenium oxide on the metallic ruthenium layer and a gaseous ruthenium oxide within the process volume. The solid ruthenium oxide is exposed to a secondary plasma to convert the solid ruthenium oxide to either metallic ruthenium or a ruthenium oxychloride compound. The metallic ruthenium is in a solid state on the metallic ruthenium layer or the ruthenium oxychloride compound is in a gaseous state within the process volume.

In other embodiments, a method of etching a material is provided. The method includes positioning a substrate in a process volume of a process chamber. The substrate includes a layer having a metallic feature and a dielectric material disposed thereon. The layer is exposed to a first plasma to produce a solid metal-containing compound on the metallic feature. The first plasma includes an oxidizing agent, a chlorinating agent, or a combination thereof. The solid metal-containing compound to a secondary plasma to remove the solid metal-containing compound from the metallic feature. The metallic feature is selectively etched with a selectivity to the metallic feature relative to the dielectric material of greater than 20:1.

In some embodiments, a method of etching a material is provided. The method includes positioning a substrate in a process volume of a process chamber. The substrate includes a metallic layer disposed thereon. The metallic layer includes metallic tungsten or metallic molybdenum. The metallic layer is exposed to a first plasma to produce a solid metal-containing compound on the metallic layer. The first plasma includes an oxidizing agent, a chlorinating agent, or a combination thereof. The solid metal-containing compound is exposed to a secondary plasma to remove the solid metal-containing compound from the metallic layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 9 depicts a cross-sectional view of a substrate with metal features, in accordance with some embodiments of the present disclosure.

FIG. 10 depicts a cross-sectional view of a substrate with metal features, in accordance with some embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
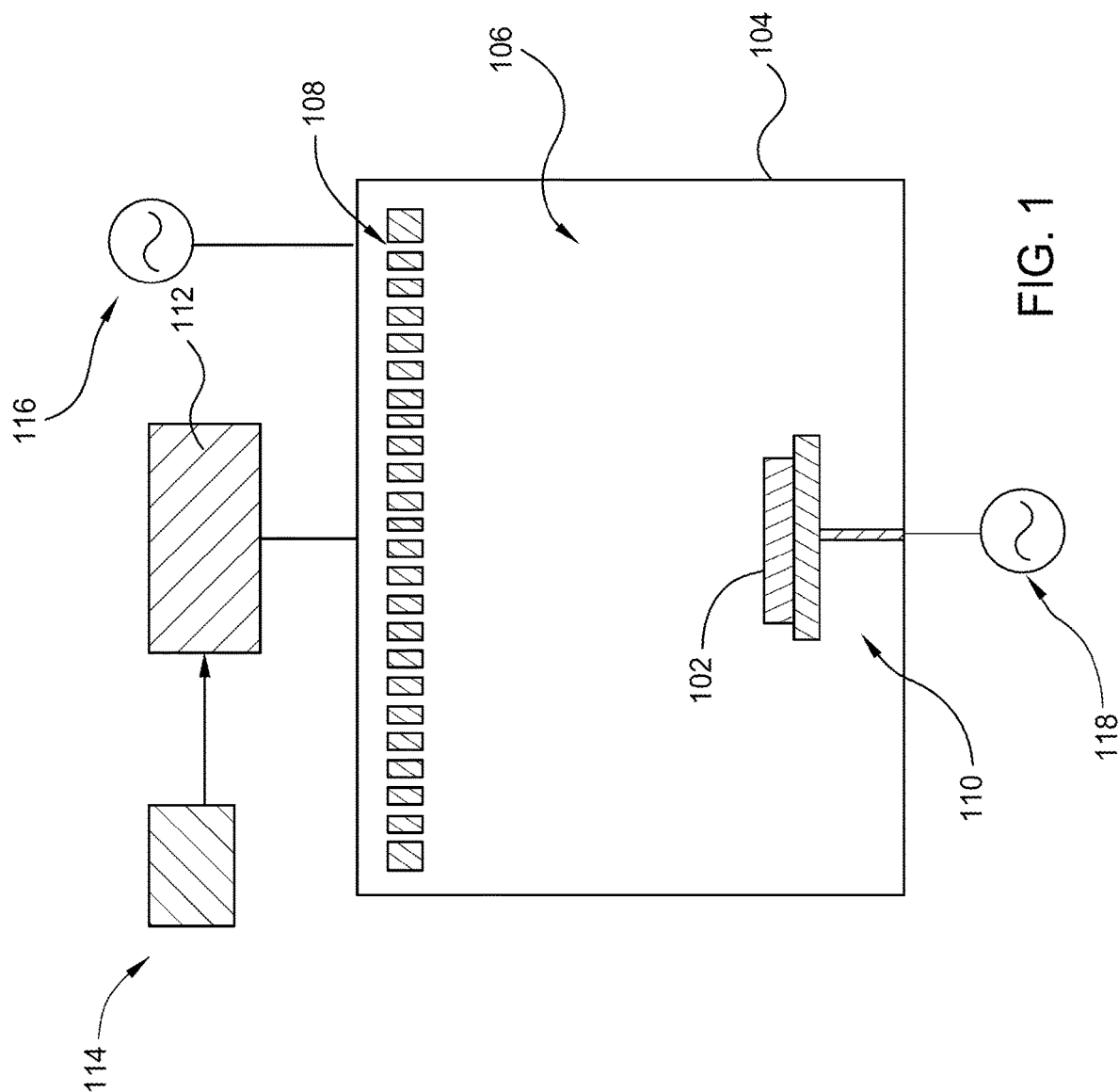
FIG. 1 depicts a schematic cross-sectional view of a process chamber, in accordance with some embodiments of the present disclosure.

Before describing embodiments of the present disclosure, it is to be understood that the disclosure is not limited to the details of construction or process set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers.

Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing methods disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the term "linewidth" refers to the width of the line of a material which may be a metal, semiconductor, or insulator.

During back-end-of line (BEOL) processing, metal and other conductive materials may be filled into layers of structures on a substrate. As transistor structures continue to shrink, and aspect ratios continue to increase, the contact landing area exposed between layers may become more critical. To maintain sufficient conductivity, a certain area of contact may be required. During lithography and patterning, small deficiencies with the area of photoresist and patterning may cause edge-placement error (EPE), where subsequent etch processes are offset, and do not sufficiently expose underlying contact pads. Additionally, many conventional etch processes, such as reactive ion etching ("RIE") may not have adequate selectivity to maintain intricate critical dimensions. Despite being a relatively anisotropic process, RIE etches may still have selectivity causing sidewall losses.

It is generally accepted that a production worthy patterning scheme at advanced technology nodes must be self-aligned and the EPE budget maximized. The need for EPE budget maximization and self-alignment is imperative for both via formation, as well as metal line block cuts in the case of 1-D or direction preferred patterning. There is also a trend of interconnect material migrating from copper (Cu), which has a low intrinsic resistivity, towards ruthenium (Ru), cobalt (Co), molybdenum (Mo), tungsten (W), and nickel (Ni), which are more desirable from the scalability perspective at sub-5 nm nodes and below, as the mean electron free path is shorter and barrierless metallization is possible. Conventional interconnect material using Cu has been found to have relatively high resistivity in small dimension applications such as less than 20 nm. In contrast, using metals such as Ru, W, and/or Mo in small applications, atomic layer etching (ALE) of the metals allows precise thickness control and reduces etch loading over different pattern dimensions. The ALE methods provided herein allows for high selectivity etch, such as a selectivity of Ru to low-K dielectric material of 20:1 selectivity or greater, such as 60:1 or greater. Methods herein use "cyclical deposition" (CD) processes which describes a sequential exposure of two or more reactive compounds to cyclically deposit a layer of material on a substrate surface and etch at least a portion of the layer of material, referred to herein as "CD trimming." The substrate, or portion of the substrate, is exposed separately to the two or more reactive compounds which are introduced into a process volume of a process chamber. As used herein, a "plasma" is ionized gas that is formed by energizing the gas and dissociating the atoms to produce radicals such as hydrogen radicals, chlorine radicals, oxygen radicals, and the like. As used herein, the term "metallic," when referring to a metal element, such as metallic Ru, W, Mo, can be pure elemental Ru, W, Mo, substantially pure Ru, W, Mo, or an alloy of the metal element.

FIG. 1 depicts a schematic cross-sectional view 100 of an exemplary process chamber 104 in accordance with some embodiments of the present disclosure. During substrate 102 processing, such as the processing described herein, process gases from one or more gas supply sources 114 are introduced to a process volume 106 of the process chamber 104. In some embodiments which can be combined with other embodiments described herein, the process gases are introduced to a remote plasma source (RPS) 112, or the process gases are introduced directly into the process volume 106. In some embodiments, which can be combined with other embodiments described herein, one or more distinct gas channels are provided to introduce certain gases to the process volume bypassing the RPS. The process volume 106 further includes a gas distribution assembly, such as a gas distribution plate 108 and a substrate support 110 with a substrate 102 disposed thereon. The substrate support 110 is disposed below the gas distribution plate 108. In some embodiments, which can be combined with other embodiments described herein, a radiofrequency (RF) energy source 116 is coupled to the gas distribution plate 108 to energize gases supplied to the process volume 106. Additionally, or alternatively, an RF energy source 116 is coupled to the RPS. The gas distribution plate 108 includes apertures disposed therethrough configured to distribute gas to the substrate 102 for processing. Additionally, or alternatively, an RF energy source 116 is electrically coupled to an inductively coupled plasma (ICP) source electrically. In some embodiments, which can be combined with other embodiments described herein, the plasmas described herein are formed by energizing process gas with the ICP source. In some embodiments, which can be combined with other embodiments described herein, the process chamber 104 includes an RF source 118 coupled to the substrate support 110. The RF source 118 applies a substrate RF bias.

Figure 2:
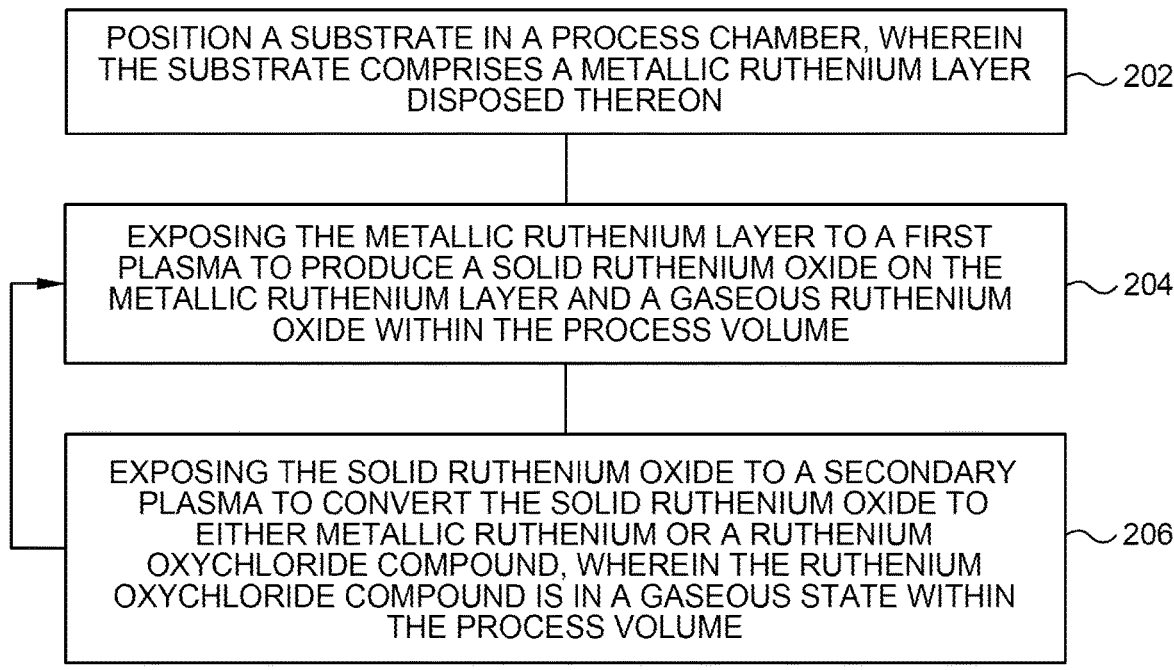
FIG. 2 is a flow diagram of an etching method, in accordance with some embodiments of the present disclosure.
Figure 3:
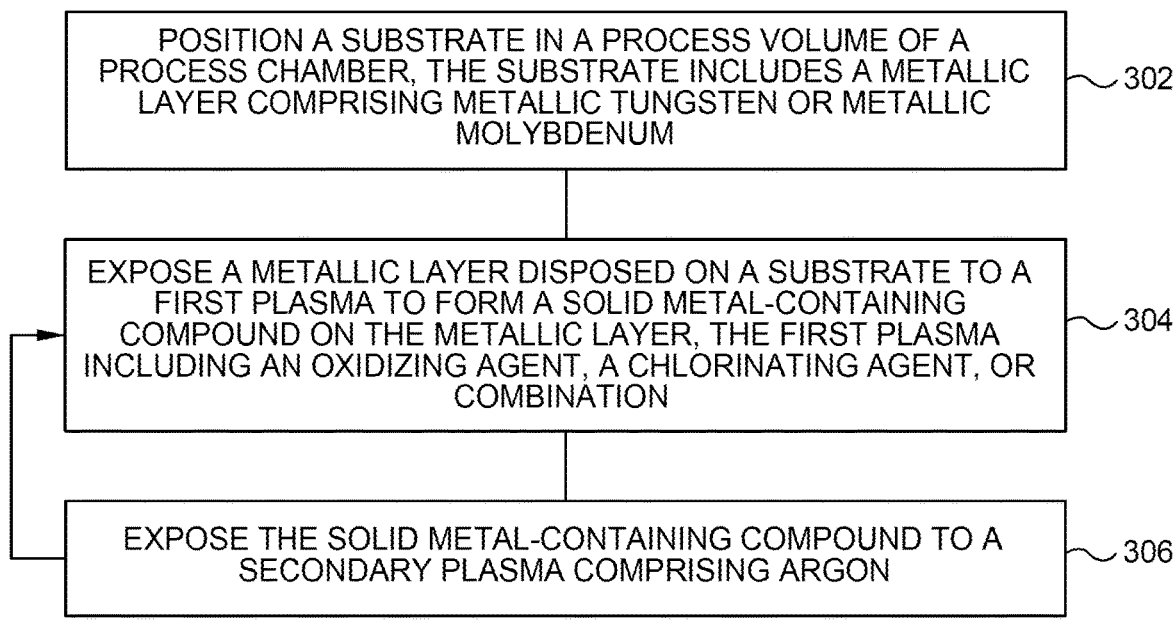
FIG. 3 is a flow diagram of an etching method, in accordance with some embodiments of the present disclosure.
Figure 4:
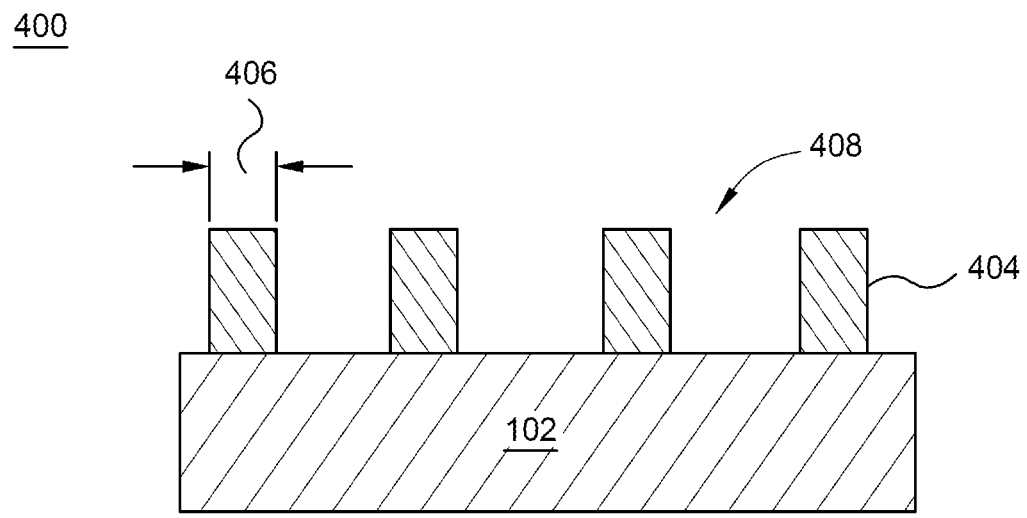
FIG. 4 depicts a cross-sectional view of a substrate with metal features, in accordance with some embodiments of the present disclosure.
Figure 5:
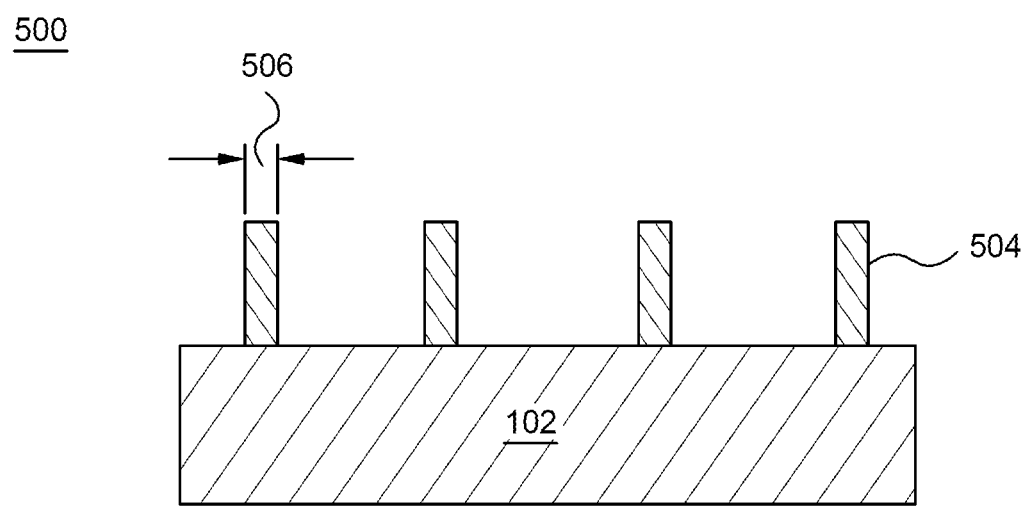
FIG. 5 depicts a cross-sectional view of a substrate with metal features, in accordance with some embodiments of the present disclosure.

FIGS. 2 and 3 are flow diagrams of etching methods 200 and 300, respectively. The methods 200, 300 are described herein with reference to FIGS. 4 and 5. FIG. 4 depicts a side cross-sectional view of a structure 400 prior to etching using method 200. The structure 400 includes a substrate 102 with metal features 404 having linewidth 406. Each metal feature 404 is spaced apart by spaces 408 relative to adjacent features. The width of the spaces 408 are uniform, or are varied between features. The feature linewidths 406 are uniform from feature to feature, or are varied. FIG. 5 depicts a cross-sectional view of an etched structure 500 after it is subjected to the etching methods 200 or 300. The etched structure includes the substrate 102 with etched metal feature 504 with a reduced linewidth 506. In some embodiments, which can be combined with other embodiments described herein, the metal features 504 are BEOL metal lines spaced apart by spaces or voids.

Referring back to FIG. 2, method 200 may include one or more operations prior to the initiation of the method, including front end processing, deposition, etching, polishing, cleaning, or any other operations that may be performed prior to the described operations. In operation 202, a substrate 102 is positioned in a process volume 106 of a process chamber 104, such as substrate support 110. The substrate 102 includes a metallic ruthenium layer disposed thereon, such as a layer having ruthenium metal features.

The first plasma is formed from a first process gas including an oxygen-containing gas, a chlorine-containing gas, or a combination thereof, such as diatomic oxygen ($O_2$), such as diatomic chlorine ($Cl_2$). In some embodiments, an atomic percentage of diatomic oxygen in the first process gas is about 80% or greater, such as 90% or greater. The first process gas includes or is mixed with a dilution gas such as He, Ar, or combination thereof. In some embodiments, the first plasma consists of oxygen plasma. The first process gas is energized with a radiofrequency energy. In some embodiments, which can be combined with other embodiments described herein, the first process gas is energized in the RPS 112. Alternatively, the first process gas is energized in the process volume 106 to form the first plasma. The first plasma is formed above the gas distribution plate 108, or below the gas distribution plate 108. The metallic ruthenium layer of the substrate is exposed to a first plasma in operation 204 to form a solid ruthenium oxide on the metallic ruthenium layer and a gaseous ruthenium oxide within the process volume. In some embodiments, at least a portion of the metallic ruthenium layer is converted to solid ruthenium oxide. The metallic ruthenium layer includes at least one metal feature 404 that is disposed on a substrate 102 and is exposed to the first plasma to form portions of solid ruthenium oxide on the features 404.

In operation 206, the solid ruthenium oxide is exposed to a secondary plasma to convert the solid ruthenium oxide to either metallic ruthenium or a ruthenium oxychloride compound. The ruthenium oxychloride compound is in a gaseous state within the process volume. With reference to FIG. 4, one or more metal features 404 is exposed to the secondary plasma.

Without being bound by theory, it is believed that the first plasma generated by the diatomic oxygen oxidizes the Ru surface to form $RuO_4$ volatile gas which has an etching effect on the Ru surface, and $RuO_2$ solid which self-limits the etching thickness. In some embodiments, which can be combined with other embodiments described herein, the secondary plasma formed in operation 206 is formed using a second gas including a hydrogen-containing gas, a chlorine-containing gas, or a combination thereof. Without being bound by theory, it is believed that the secondary plasma formed from diatomic hydrogen chemically reduces the $RuO_2$ to form Ru. In some examples, the secondary plasma contains, consists of, or essentially consists of hydrogen plasma In other examples, the secondary plasma contains, consists of, or essentially consists of chlorine-based plasma.

With respect to a secondary plasma formed by chlorine gas, it is believed that the secondary plasma formed by chlorine reacts with $RuO_2$ to form $RuLCl_x$ gas. Alternatively, etching using a secondary plasma formed from diatomic hydrogen ($H_2$) is substantially free of corrosion and is capable reducing the thickness of at least a portion of the Ru features without any wet etching processes. In some embodiments, which can be combined with other embodiments described herein, etching using a secondary plasma formed from chlorine gas further includes exposing the metal feature to hydrogen to prevent, reduce, and/or reverse corrosion. The etching kinetics using the secondary plasma formed form from chlorine gas is substantially linear relative and gradual over time relative to conventional etching processes.

Similar to method 200, method 300 includes positioning a substrate in a process volume of a process chamber in operation 302. The substrate includes a metallic layer including a metallic tungsten (W), or metallic molybdenum (Mo). In operation 304, the metallic layer is exposed to a first plasma to form a solid metal-containing compound on the metallic layer. The first plasma includes an oxidizing agent, a chlorinating agent, or combination thereof. In some embodiments, the first plasma is formed from a first process gas including oxygen, chlorine, or a combination thereof. The first process gas is free of fluorine-containing gases, or the first gas is mixed with or includes fluorine-containing gases such as nitrogen trifluoride ($NF_3$). An atomic percentage of diatomic oxygen and/or chlorine in the first process gas is about 80% or greater, such as 90% or greater. Nitrogen trifluoride is increased, decreased, or removed to adjust the etching rate. An increase in concentration of nitrogen trifluoride increases etch rate. In some embodiments, the first process gas is mixed with or includes an inert gas such as argon or helium. In operation 306, the solid metal-containing compound is exposed to a secondary plasma including argon plasma. Without being bound by theory, it is believed that the argon plasma etches the solid metal-containing compound by ion bombardment. In some embodiments, which can be combined with other embodiments described herein, exposing the secondary plasma including argon plasma includes applying an RF power from the ICP power source, applying an RF bias to the substrate using RF source 118, or applying RF from ICP power source and RF source 118.

In both methods 200 and 300, the source power of the RF source applied to the first and/or second process gas is about 50 W to about 2000 W, such as about about 500 W to about 1500 W, such as about 700 W to about 1000 W, or about 1200 W to about 1500 W, or about 1600 W to about 1800 W. The process volume includes pressure of about 1 mTorr to about 60 mTorr, such as about 10 mTorr to about 40 mTorr, such as about 20 mTorr to about 30 mTorr. A substrate temperature of about 20° C. to about 100° C., such as about 30° C. to about 40° C., is maintained during method 200. In both methods 200 and 300, a bias power can be applied to the substrate support in one or more operations at a power of about 20 W to about 100 W, such as about 30 W to about 50 W.

Operations 204 and 206, as described herein, together forms one cycle of a cyclical deposition process. Similarly, operations 304 and 306, as described herein, together forms one cycle. Each cycle reduces a thickness of a metal feature by about 0.5 nm to about 5 nm, such as about 1 nm to about 2 nm. Operations 204 and 206, or 304 and 306, are repeated at least once to control etching of the metal features. The thickness that is reduced from at least one portion of the metal feature refers a thickness removed from any surface of at least one portion of the metal features, such as a top of a metal feature, or a side of a metal feature. Each of operations 204, 206, 304, 306 includes a duration of about 0.5 seconds to about 1 minute, such as about 1 second to about 30 seconds, such as about 3 seconds to about 5 seconds. Switching between operations is nearly instantaneous using fast switching gas delivery systems.

Conventional etching processes are too aggressive for structures having small features, such as between about 5 nm to about 20 nm, and do not have precise thickness reduction control. The etching rate for method 200 or method 300 is about 0.1 nm per second to about 10 nm per second, such as about 0.15 nm per second to about 5 nm per second, such as about 0.2 nm per second to about 3 nm per second, or about 0.5 nm per second to about 1 nm per second, or about 0.7 nm per second to about 2 nm per second. Prior to one or more of operations 204 and 206, or operations 304 and 306, a purge gas is supplied to purge byproducts produced. The purge gas includes helium, argon, nitrogen, or a combination thereof. A purging operation is about 1 second to 10 seconds, such as about 3 seconds to about 5 seconds. Alternatively, operations 204 and 206 are cyclically repeated without purging operations between. In some embodiments, which can be combined with other embodiments described herein, RF power is supplied continuously simultaneously with operations 204 and 206, or operations 304 and 306.

Figure 6:
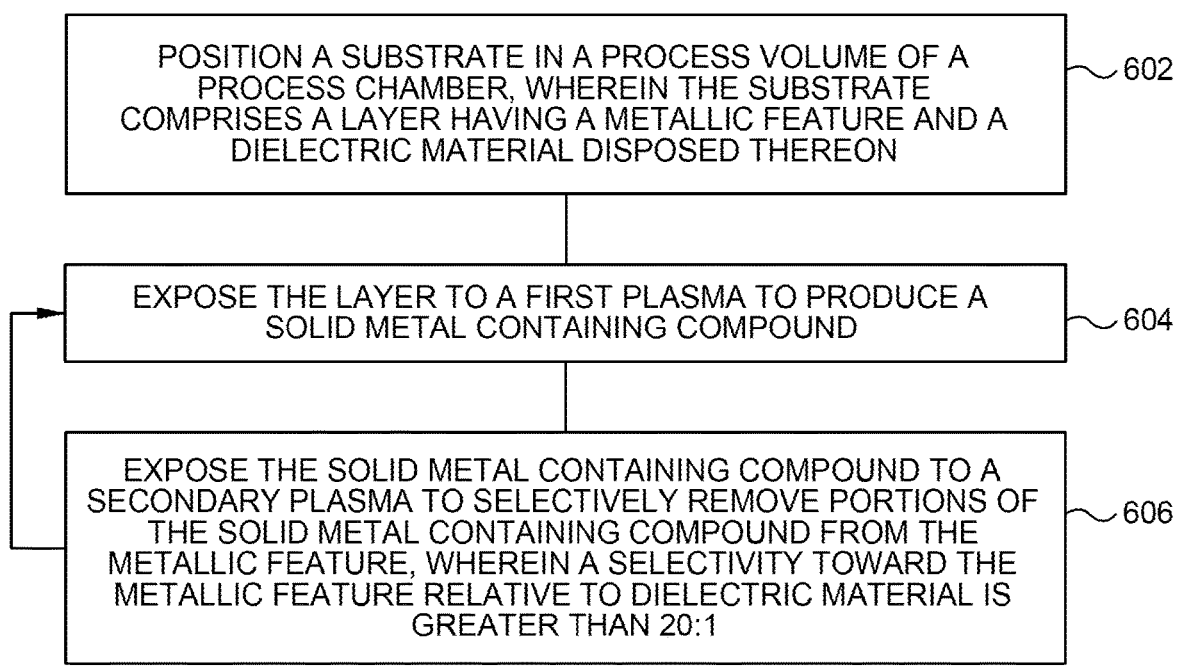
FIG. 6 depicts a flow diagram of an etching method, in accordance with some embodiments of the present disclosure.

FIG. 6 depicts a flow diagram of etching method 600, in accordance with some embodiments of the present disclosure. The method 600 includes process conditions substantially the same as the process conditions described relative to method 200 for ruthenium metal features, or method 300 for Mo or W metal features, such as process gases, RF power supply, temperature, and pressures. The method 600 is described herein with reference to FIGS. 7-10. Method 600 includes, in operation 602, positioning a substrate 102 in a process volume 106 of a process chamber 104. The substrate 102 includes a layer having a metallic feature and a dielectric material (e.g., 700 or 900) disposed thereon. The substrate 102 includes a layer having a metal feature 704, 906 and a dielectric material 706, 904. The dielectric material is any number of dielectrics, including interlayer dielectrics such as low-k materials, flowable oxides, ultra-low-k materials, or any other suitable material used between and within layers of semiconductor materials. In some embodiments, which can be combined with other embodiments described herein, a low-k material has a k-value of about 3.0 or less, such as about 2.5 to about 3.0. In some embodiments, an ultra-low-k material is a material having a K-value of about 2.5 or less. In operation 604, the layer is exposed to a first plasma to produce a metal-containing compound. For layers including ruthenium, the conditions described in method 200 are used, and for layers including tungsten and/or molybdenum, the conditions described in method 300 are used.

Figure 7:
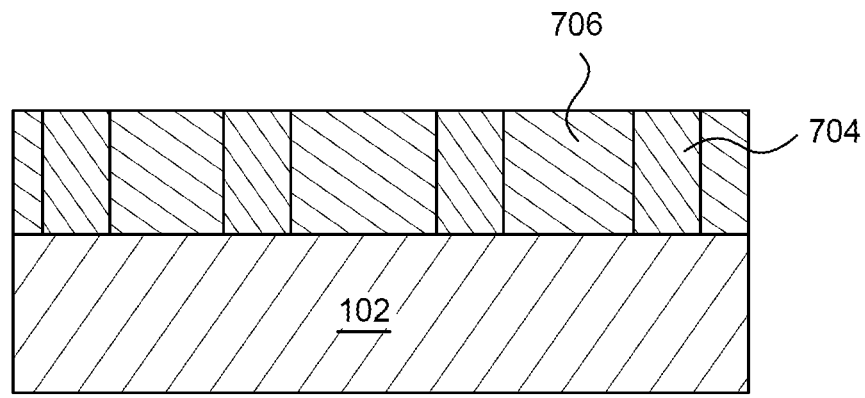
FIG. 7 depicts a cross-sectional view of a substrate with metal features, in accordance with some embodiments of the present disclosure.
Figure 8:
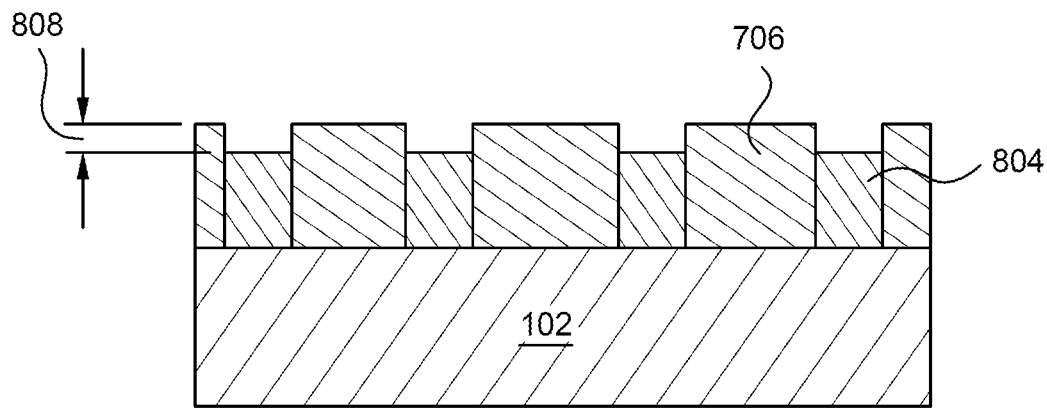
FIG. 8 depicts a cross-sectional view of a substrate with metal features, in accordance with some embodiments of the present disclosure.

In operation 606, the solid metal-containing compound is exposed to a secondary plasma. The secondary plasma is formed from a second process gas that is supplied to the process volume 106. Operations 604 and 606 etch metal features 704, such as Ru features, Mo features, or W features to form recessed metal features 804 as depicted in FIGS. 7 and 8. In some embodiments, which can be combined with other embodiments described herein, the metal features 704 are BEOL metal lines or vias. The etching chemistry includes a high selectivity to the metal features 704, 906 relative to surrounding materials such as dielectric material 706, 904. The selectivity of the metal to dielectric material is about 10:1 or greater, such as about 20:1 or greater. High selectivity enables recessing metal features without etching adjacent dielectric materials. The recessed feature 804 is shown in FIG. 8 with a recess thickness of 808. FIG. 9 depicts metal material 906 formed over (e.g., a peak portion 910) and between (e.g., a valley portion 908) dielectric material 904. Etching the metal material 906 can be controlled to produce an etched structure 1000 shown in FIG. 10 (e.g., etched metal 1006). High selectivity and the use of hardmasks disposed above the structure 900 enables etching with high selectivity to form etched structure 1000. Good thickness control and high selectivity has not been previously demonstrated for certain metals such as Ru, Mo, and/or W with metal features with dimensions less than about 20 nm.

The source power of the RF source applied to the first and/or second process gas is about 50 W to about 2000 W, such as about 500 W to about 1500 W, such as about 700 W to about 1000 W, or about 1200 W to about 1500 W, or about 1600 W to about 1800 W. The process volume includes pressure of about 1 mTorr to about 60 mTorr, such as about 10 mTorr to about 40 mTorr, such as about 20 mTorr to about 30 mTorr. A substrate temperature of about 20° C. to about 100° C., such as about 30° C. to about 40° C., is maintained. A bias power can be applied to the substrate support in one or more operations at a power of about 20 W to about 100 W, such as about 30 W to about 50 W.

Each of operations 604 and 606 include a duration of about 0.5 seconds to about 1 minute, such as about 1 second to about 30 seconds, such as about 3 seconds to about 5 seconds. A substrate temperature of about 30° C. to about 40° C. is maintained during method 600. Each of the metal features described herein have portions having aspect ratios of about 5 or greater, such as 10 or greater, such as 20 or greater. The etching rate for method 600 is about 0.1 nm per second to about 10 nm per second, such as about 0.15 nm per second to about 5 nm per second, such as about 0.2 nm per second to about 3 nm per second, or about 0.5 nm per second to about 1 nm per second, or about 0.7 nm per second to about 2 nm per second. Prior to one or more of operations 604 and 606, a purge gas is supplied to purge byproducts produced within the process volume 104. The purge gas includes helium, argon, diatomic hydrogen or a combination thereof. A purging operation is about 1 second to 10 seconds, such as about 3 seconds to about 5 seconds. Alternatively, operations 604 and 606 are cyclically repeated without purging operations between. In some embodiments, which can be combined with other embodiments described herein, RF power is supplied continuously simultaneously with operations 604 and 606. It has been found that purging improves the gas transition purity between operations.

In summation, the present disclosure describes a method for precise atomic layer etching of BEOL metals excluding copper such as Ru, W, Mo, alloys thereof, or a combination thereof. Precise etching of metals include selective etching relative to dielectric materials. Recessing and forming of high aspect ratio features are formed using methods described herein, which include self-limiting etching gases for controlled and more linear etching kinetics over time relative to conventional processes.

What is claimed is:

1. A method for etching a material, comprising:
   positioning a substrate in a process volume of a process chamber, wherein the substrate comprises a metallic ruthenium layer disposed thereon;
   exposing the metallic ruthenium layer having a first thickness to an oxygen plasma to produce a solid ruthenium oxide on the metallic ruthenium layer and a gaseous ruthenium oxide within the process volume, the solid ruthenium oxide having a second thickness that reduces the first thickness of the metallic ruthenium layer to a third thickness;
   exposing the solid ruthenium oxide to a hydrogen plasma, the hydrogen plasma being introduced after removing the gaseous ruthenium oxide from the process volume to convert the solid ruthenium oxide back to metallic ruthenium, increasing the third thickness of the metallic ruthenium layer to a fourth thickness that is less than the first thickness.

2. The method of claim 1, wherein the solid ruthenium oxide comprises ruthenium dioxide and the gaseous ruthenium oxide comprises ruthenium tetroxide.

3. The method of claim 1, wherein the thickness of the metallic ruthenium layer is reduced by about 0.5 nm to about 2 nm per cycle of exposing to the oxygen plasma and to the hydrogen plasma.

4. The method of claim 1, further comprising exposing to the oxygen plasma for about 3 seconds to about 5 seconds.

5. The method of claim 1, wherein the oxygen plasma is generated from oxygen gas ($O_2$).

6. The method of claim 1, wherein the oxygen plasma further comprises nitrogen gas.

7. The method of claim 1, further comprising purging the process volume with a nonreactive gas between exposing the metallic ruthenium layer to an oxygen plasma and exposing the solid ruthenium oxide to the hydrogen plasma, wherein the nonreactive gas comprises helium, argon, nitrogen ($N_2$), or a combination thereof.

8. The method of claim 1, wherein the process volume is maintained at a pressure of about 3 mTorr to about 60 mTorr and the substrate is maintained at a substrate temperature of about 30° C. to about 40° C.

9. The method of claim 1, wherein the metallic ruthenium forms a metallic ruthenium feature having an aspect ratio of 5 or greater and at least one dimension of less than 20 nm.

10. The method of claim 1, further comprising exposing the metallic ruthenium layer having the fourth thickness to the oxygen plasma to produce a nonvolatile solid ruthenium oxide on the metallic ruthenium layer and a gaseous ruthenium oxide within the process volume, the solid ruthenium oxide having a fifth thickness that reduces the fourth thickness of the metallic ruthenium layer to a sixth thickness.

11. A method of etching a material, comprising:
positioning a substrate in a process volume of a process chamber, wherein the substrate comprises a layer comprising a molybdenum metallic feature and a dielectric material disposed thereon;
exposing the layer to a first plasma to produce a solid metal-containing compound on the metallic feature, wherein the first plasma comprises an oxidizing agent, a chlorinating agent, or a combination thereof, and the substrate is maintained at a temperature of 100 degrees Celsius or lower; and
exposing the solid metal-containing compound to a secondary plasma to remove the solid metal-containing compound from the metallic feature, wherein the metallic feature is selectively etched relative to the dielectric material with a selectivity of greater than 20:1, and the substrate is maintained at a temperature of 100 degrees Celsius or lower.

12. The method of claim 11, wherein the first plasma further comprises a fluorine-containing gas.

13. The method of claim 12, wherein the fluorine-containing gas comprises nitrogen trifluoride ($NF_3$).

14. The method of claim 11, wherein the process volume is maintained at a pressure of about 3 mTorr to about 60 mTorr.

15. The method of claim 11, further comprising repeating a process cycle of exposing the layer to the first plasma and exposing the solid metal-containing compound to the secondary plasma, wherein each of the process cycles etches a thickness of about 1 nm from at least one portion of the metallic feature.

16. The method of claim 11, wherein the dielectric material is selected from the group consisting of a low-k material, a flowable oxide, an ultra-low-k material, and any combination thereof.

17. A method for etching a material, comprising:
positioning a substrate in a process volume of a process chamber, wherein the substrate comprises a metallic layer disposed thereon, and wherein the metallic layer is a metallic molybdenum layer;
exposing the metallic layer to a first plasma to produce a solid metal-containing compound on the metallic layer, wherein the substrate is maintained at a temperature of 100 degrees Celsius or lower and the first plasma comprises an oxidizing agent, a chlorinating agent, or a combination thereof; and
exposing the solid metal-containing compound to a secondary plasma to remove the solid metal-containing compound from the metallic layer.

18. The method of claim 17, wherein the metallic layer is exposed to the first plasma for about 3 seconds to about 5 seconds, and the solid metal-containing compound is exposed to the secondary plasma for about 3 seconds to about 5 seconds.

* * * * *